(12) United States Patent
Koyanagi et al.

(10) Patent No.: US 6,542,429 B2
(45) Date of Patent: Apr. 1, 2003

(54) METHOD OF CONTROLLING LINE MEMORY

(75) Inventors: Daisuke Koyanagi, Kanagawa (JP); Yuichi Ueki, Kanagawa (JP)

(73) Assignee: Sony Corporation, Tokyo (JP)

( * ) Notice: Subject to any disclaimer, the term of this patent is extended or adjusted under 35 U.S.C. 154(b) by 25 days.

(21) Appl. No.: 09/823,827

(22) Filed: Mar. 30, 2001

(65) Prior Publication Data

US 2001/0048628 A1 Dec. 6, 2001

(30) Foreign Application Priority Data

Mar. 31, 2000 (JP) ........................................ 2000-096961

(51) Int. Cl.[7] ................................................ G11C 7/00
(52) U.S. Cl. ............................ 365/230.03; 365/189.01; 365/189.05
(58) Field of Search ....................... 365/189.01, 230.03, 365/189.05; 712/34

(56) References Cited

U.S. PATENT DOCUMENTS 6,026,194 A1 * 2/2002 Torikai et al. .............. 382/232
6,388,706 B1 * 5/2002 Takizawa et al. ........... 348/273

* cited by examiner

Primary Examiner—Vu A. Le
(74) Attorney, Agent, or Firm—Frommer Lawrence & Haug LLP; William S. Frommer

(57) ABSTRACT

A line memory control method for temporarily writing input image data into a line memory and reading out the image data written in the line memory on a block basis, comprising: a pre-processing step of reducing the data rate of the input image data; a writing step of successively writing the pre-processed image data into a line memory every line by using a first address; and a reading/writing step of reading out the image data on a line basis every block by using a second address different from the first address after said writing step is finished, and writing image data into a read-out block by using the second address.

4 Claims, 18 Drawing Sheets

FIG.4

| ADDRESS | BASIC ADDRESS COUNT | ADDRESS 1 | ADDRESS 2 | ADDRESS 3 | ADDRESS 4 | ADDRESS 5 | ADDRESS 6 | DATA AREA |
|---|---|---|---|---|---|---|---|---|
| 1 | 1 | 1 | 1 | 1 | 1 | 1 | 1 | 1ST BLOCK, 1ST LINE |
| 2 | 2 | 2 | 2 | 2 | 2 | 2 | 2 | |
| 3 | 3 | 3 | 3 | 3 | 3 | 3 | 3 | |
| 4 | 4 | 4 | 4 | 4 | 4 | 4 | 4 | |
| 5 | 5 | 65 | 9 | 129 | 17 | 257 | 33 | 1ST BLOCK, 2ND LINE |
| 6 | 6 | 66 | 10 | 130 | 18 | 258 | 34 | |
| 7 | 7 | 67 | 11 | 131 | 19 | 259 | 25 | |
| 8 | 8 | 68 | 12 | 132 | 20 | 260 | 36 | |
| 9 | 9 | 129 | 17 | 257 | 33 | 5 | 65 | 1ST BLOCK, 3RD LINE |
| 10 | 10 | 130 | 18 | 258 | 34 | 6 | 66 | |
| 11 | 11 | 131 | 19 | 259 | 35 | 7 | 67 | |
| 12 | 12 | 132 | 20 | 260 | 36 | 8 | 68 | |
| 13 | 13 | 193 | 25 | 385 | 49 | 261 | 97 | 1ST BLOCK, 4TH LINE |
| 14 | 14 | 194 | 26 | 386 | 50 | 262 | 98 | |
| 15 | 15 | 195 | 27 | 387 | 51 | 263 | 99 | |
| 16 | 16 | 196 | 28 | 388 | 52 | 264 | 100 | |
| 17 | 17 | 257 | 33 | 5 | 65 | 9 | 129 | 1ST BLOCK, 5TH LINE |
| 18 | 18 | 258 | 34 | 6 | 66 | 10 | 130 | |
| 19 | 19 | 259 | 35 | 7 | 67 | 11 | 131 | |
| 20 | 20 | 260 | 36 | 8 | 68 | 12 | 132 | |
| 21 | 21 | 321 | 41 | 133 | 81 | 265 | 161 | 1ST BLOCK, 6TH LINE |
| 22 | 22 | 322 | 42 | 134 | 82 | 266 | 162 | |
| 23 | 23 | 323 | 43 | 135 | 83 | 267 | 163 | |
| 24 | 24 | 324 | 44 | 136 | 84 | 268 | 164 | |
| 25 | 25 | 385 | 49 | 261 | 97 | 13 | 193 | 1ST BLOCK, 7TH LINE |
| 26 | 26 | 386 | 50 | 262 | 98 | 14 | 194 | |
| 27 | 27 | 387 | 51 | 263 | 99 | 15 | 195 | |
| 28 | 28 | 388 | 52 | 264 | 100 | 16 | 196 | |
| 29 | 29 | 449 | 57 | 389 | 113 | 269 | 225 | 1ST BLOCK, 8TH LINE |
| 30 | 30 | 450 | 58 | 390 | 114 | 270 | 226 | |
| 31 | 31 | 451 | 59 | 391 | 115 | 271 | 227 | |
| 32 | 32 | 452 | 60 | 392 | 116 | 272 | 228 | |

FIG.5

| | | | | | | | |
|---|---|---|---|---|---|---|---|
| 481 | 481 | 61 | 453 | 121 | 397 | 241 | 285 | 16TH BLOCK, 1ST LINE |
| 482 | 482 | 62 | 454 | 122 | 398 | 242 | 286 | |
| 483 | 483 | 63 | 455 | 123 | 399 | 243 | 287 | |
| 484 | 484 | 64 | 456 | 124 | 400 | 244 | 288 | |
| 485 | 485 | 125 | 461 | 249 | 413 | 497 | 317 | 16TH BLOCK, 2ND LINE |
| 486 | 486 | 126 | 462 | 250 | 414 | 498 | 318 | |
| 487 | 487 | 127 | 463 | 251 | 415 | 499 | 319 | |
| 488 | 488 | 128 | 464 | 252 | 416 | 500 | 320 | |
| 489 | 489 | 189 | 469 | 377 | 429 | 245 | 349 | 16TH BLOCK, 3RD LINE |
| 490 | 490 | 190 | 470 | 378 | 430 | 246 | 350 | |
| 491 | 491 | 191 | 471 | 379 | 431 | 247 | 351 | |
| 492 | 492 | 192 | 472 | 380 | 432 | 248 | 352 | |
| 493 | 493 | 253 | 477 | 505 | 445 | 501 | 381 | 16TH BLOCK, 4TH LINE |
| 494 | 494 | 254 | 478 | 506 | 446 | 502 | 382 | |
| 495 | 495 | 255 | 479 | 507 | 447 | 503 | 383 | |
| 496 | 496 | 256 | 480 | 508 | 448 | 504 | 384 | |
| 497 | 497 | 317 | 485 | 125 | 461 | 249 | 413 | 16TH BLOCK, 5TH LINE |
| 498 | 498 | 318 | 486 | 126 | 462 | 250 | 414 | |
| 499 | 499 | 319 | 487 | 127 | 463 | 251 | 415 | |
| 500 | 500 | 320 | 488 | 128 | 464 | 252 | 416 | |
| 501 | 501 | 381 | 493 | 253 | 477 | 505 | 445 | 16TH BLOCK, 6TH LINE |
| 502 | 502 | 382 | 494 | 254 | 478 | 506 | 446 | |
| 503 | 503 | 383 | 495 | 255 | 479 | 507 | 447 | |
| 504 | 504 | 384 | 496 | 256 | 480 | 508 | 448 | |
| 505 | 505 | 445 | 501 | 381 | 493 | 253 | 477 | 16TH BLOCK, 7TH LINE |
| 506 | 506 | 446 | 502 | 382 | 494 | 254 | 478 | |
| 507 | 507 | 447 | 503 | 383 | 495 | 255 | 479 | |
| 508 | 508 | 448 | 504 | 384 | 496 | 256 | 480 | |
| 509 | 509 | 509 | 509 | 509 | 509 | 509 | 509 | 16TH BLOCK, 8TH LINE |
| 510 | 510 | 510 | 510 | 510 | 510 | 510 | 510 | |
| 511 | 511 | 511 | 511 | 511 | 511 | 511 | 511 | |
| 512 | 512 | 512 | 512 | 512 | 512 | 512 | 512 | |

FIG.6A

DATA WRITE USING BASIC ADDRESS COUNT

| 1 | 2 | 3 | 4 | 5 | 6 | 7 | 8 |
|---|---|---|---|---|---|---|---|
| 65 | 66 | 67 | 68 | 69 | 70 | 71 | 72 |
| 129 | 130 | 131 | 132 | 133 | 134 | 135 | 136 |
| 193 | 194 | 195 | 196 | 197 | 198 | 199 | 200 |
| 257 | 258 | 259 | 260 | 261 | 262 | 263 | 264 |
| 321 | 322 | 323 | 324 | 325 | 326 | 327 | 328 |
| 385 | 386 | 387 | 388 | 389 | 390 | 391 | 392 |
| 449 | 450 | 451 | 452 | 453 | 454 | 455 | 456 |
| ... | ... | ... | ... | ... | ... | ... | ... |
| 57 | 58 | 59 | 60 | 61 | 62 | 63 | 64 |
| 121 | 122 | 123 | 124 | 125 | 126 | 127 | 128 |
| 185 | 186 | 187 | 188 | 189 | 190 | 191 | 192 |
| 249 | 250 | 251 | 252 | 253 | 254 | 255 | 256 |
| 313 | 314 | 315 | 316 | 317 | 318 | 319 | 320 |
| 377 | 378 | 379 | 380 | 381 | 382 | 383 | 384 |
| 341 | 342 | 343 | 344 | 345 | 346 | 347 | 348 |
| 505 | 506 | 507 | 508 | 509 | 510 | 511 | 512 |

FIG.6B

DATA READ, WRITE USING ADDRESS 1

| 1 | 2 | 3 | 4 | 33 | 34 | 35 | 36 |
|---|---|---|---|---|---|---|---|
| 5 | 6 | 7 | 8 | 37 | 38 | 39 | 40 |
| 9 | 10 | 11 | 12 | 41 | 42 | 43 | 44 |
| 13 | 14 | 15 | 16 | 45 | 46 | 47 | 48 |
| 17 | 18 | 19 | 20 | 49 | 50 | 51 | 52 |
| 21 | 22 | 23 | 24 | 53 | 54 | 55 | 56 |
| 25 | 26 | 27 | 28 | 57 | 58 | 59 | 60 |
| 29 | 30 | 31 | 32 | 61 | 62 | 63 | 64 |
| ... | ... | ... | ... | ... | ... | ... | ... |
| 449 | 450 | 451 | 452 | 481 | 482 | 483 | 484 |
| 453 | 454 | 455 | 456 | 485 | 486 | 487 | 488 |
| 457 | 458 | 459 | 460 | 489 | 490 | 491 | 492 |
| 461 | 462 | 463 | 464 | 493 | 494 | 495 | 496 |
| 465 | 466 | 467 | 468 | 497 | 498 | 499 | 500 |
| 469 | 470 | 471 | 472 | 501 | 502 | 503 | 504 |
| 473 | 474 | 475 | 476 | 505 | 506 | 507 | 508 |
| 477 | 478 | 479 | 480 | 509 | 510 | 511 | 512 |

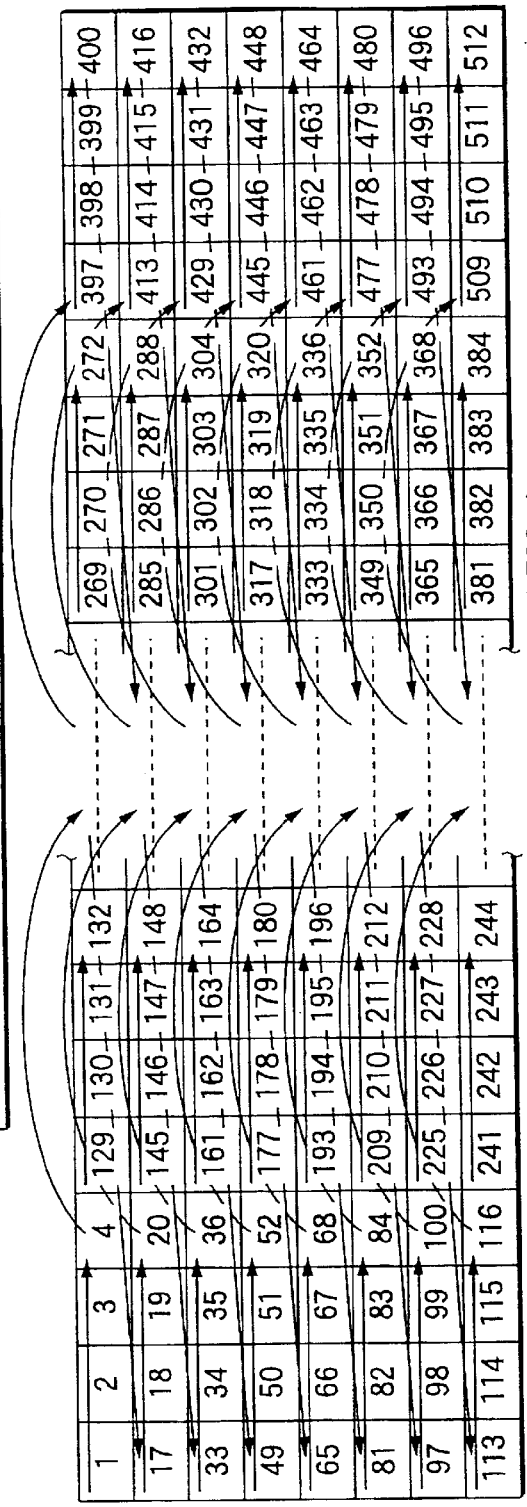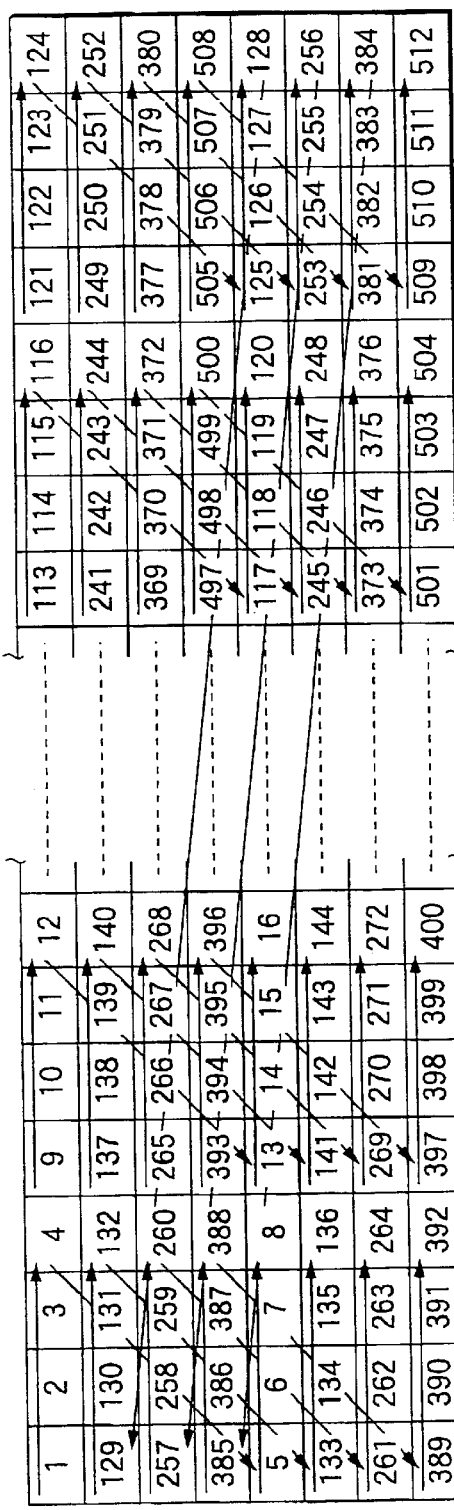
FIG.8A
FIG.8B

FIG.17A — WRITING OPERATION

| 1 | 2 | 3 | 4 | 5 | 6 | 7 | 8 | ... | 121 | 122 | 123 | 124 | 125 | 126 | 127 | 128 |
|---|---|---|---|---|---|---|---|---|---|---|---|---|---|---|---|---|
| 129 | 130 | 131 | 132 | 133 | 134 | 135 | 136 | ... | 249 | 250 | 251 | 252 | 253 | 254 | 255 | 256 |
| 257 | 258 | 259 | 260 | 261 | 262 | 263 | 264 | ... | 377 | 378 | 379 | 380 | 381 | 382 | 383 | 384 |
| 385 | 386 | 387 | 388 | 389 | 390 | 391 | 392 | ... | 505 | 506 | 507 | 508 | 509 | 510 | 511 | 512 |
| 513 | 514 | 515 | 516 | 517 | 518 | 519 | 520 | ... | 633 | 634 | 635 | 636 | 637 | 638 | 639 | 640 |
| 641 | 642 | 643 | 644 | 645 | 646 | 647 | 648 | ... | 761 | 762 | 763 | 764 | 765 | 766 | 767 | 768 |
| 769 | 770 | 771 | 772 | 773 | 774 | 775 | 776 | ... | 889 | 890 | 891 | 892 | 893 | 894 | 895 | 896 |
| 897 | 898 | 899 | 900 | 901 | 902 | 903 | 904 | ... | 1017 | 1018 | 1019 | 1020 | 1021 | 1022 | 1023 | 1024 |

FIG.17B — READING OPERATION

| 1 | 2 | 3 | 4 | 5 | 6 | 7 | 8 | ... | 961 | 962 | 963 | 964 | 965 | 966 | 967 | 968 |
|---|---|---|---|---|---|---|---|---|---|---|---|---|---|---|---|---|
| 9 | 10 | 11 | 12 | 13 | 14 | 15 | 16 | ... | 969 | 970 | 971 | 972 | 973 | 974 | 975 | 976 |
| 17 | 18 | 19 | 20 | 21 | 22 | 23 | 24 | ... | 977 | 978 | 979 | 980 | 981 | 982 | 983 | 984 |
| 25 | 26 | 27 | 28 | 29 | 30 | 31 | 32 | ... | 985 | 986 | 987 | 988 | 989 | 990 | 991 | 992 |
| 33 | 34 | 35 | 36 | 37 | 38 | 39 | 40 | ... | 993 | 994 | 995 | 996 | 997 | 998 | 999 | 1000 |
| 41 | 42 | 43 | 44 | 45 | 46 | 47 | 48 | ... | 1001 | 1002 | 1003 | 1004 | 1005 | 1006 | 1007 | 1008 |
| 49 | 50 | 51 | 52 | 53 | 54 | 55 | 56 | ... | 1009 | 1010 | 1011 | 1012 | 1013 | 1014 | 1015 | 1016 |
| 57 | 58 | 59 | 60 | 61 | 62 | 63 | 64 | ... | 1017 | 1018 | 1019 | 1020 | 1021 | 1022 | 1023 | 1024 |

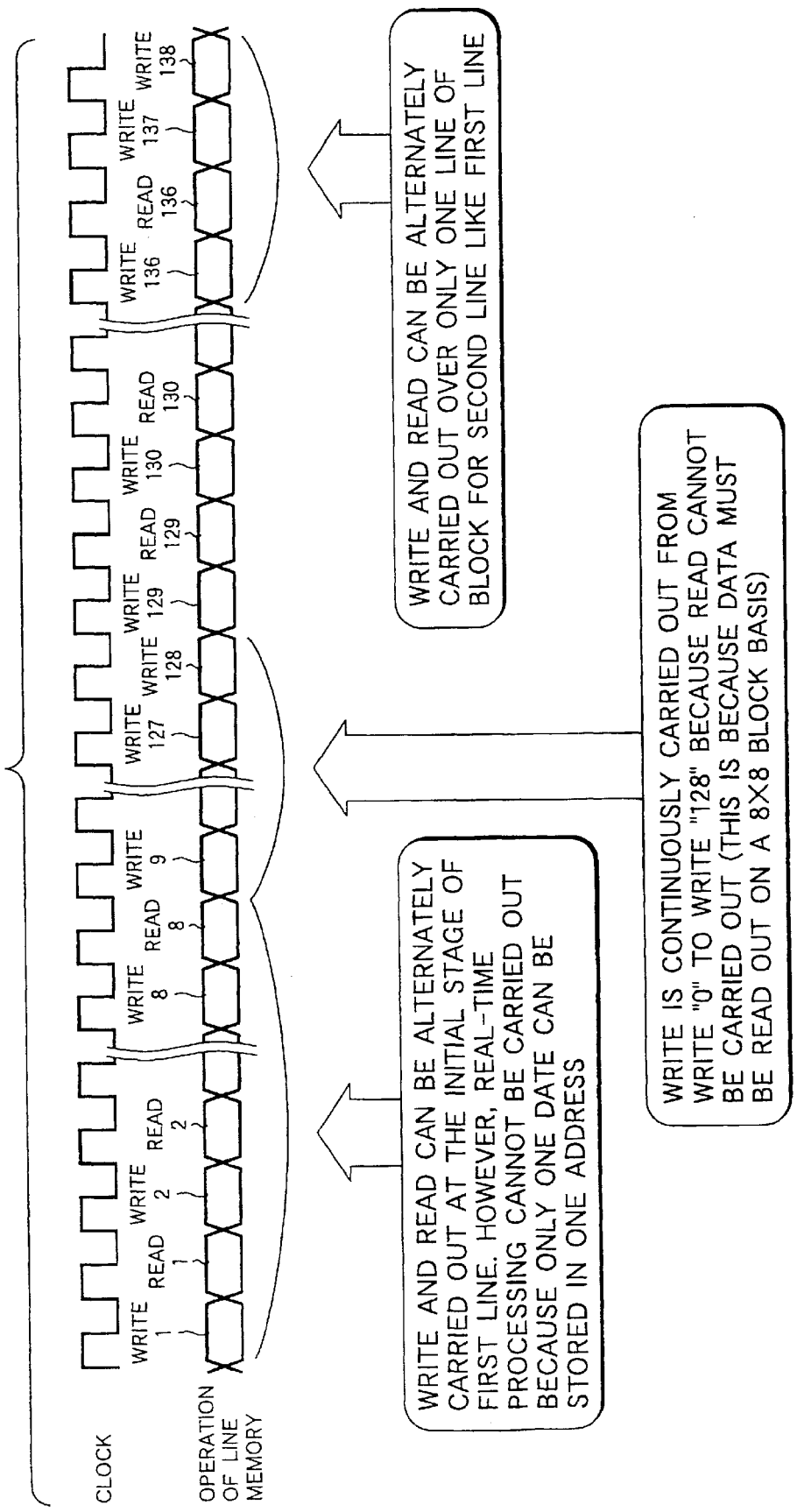

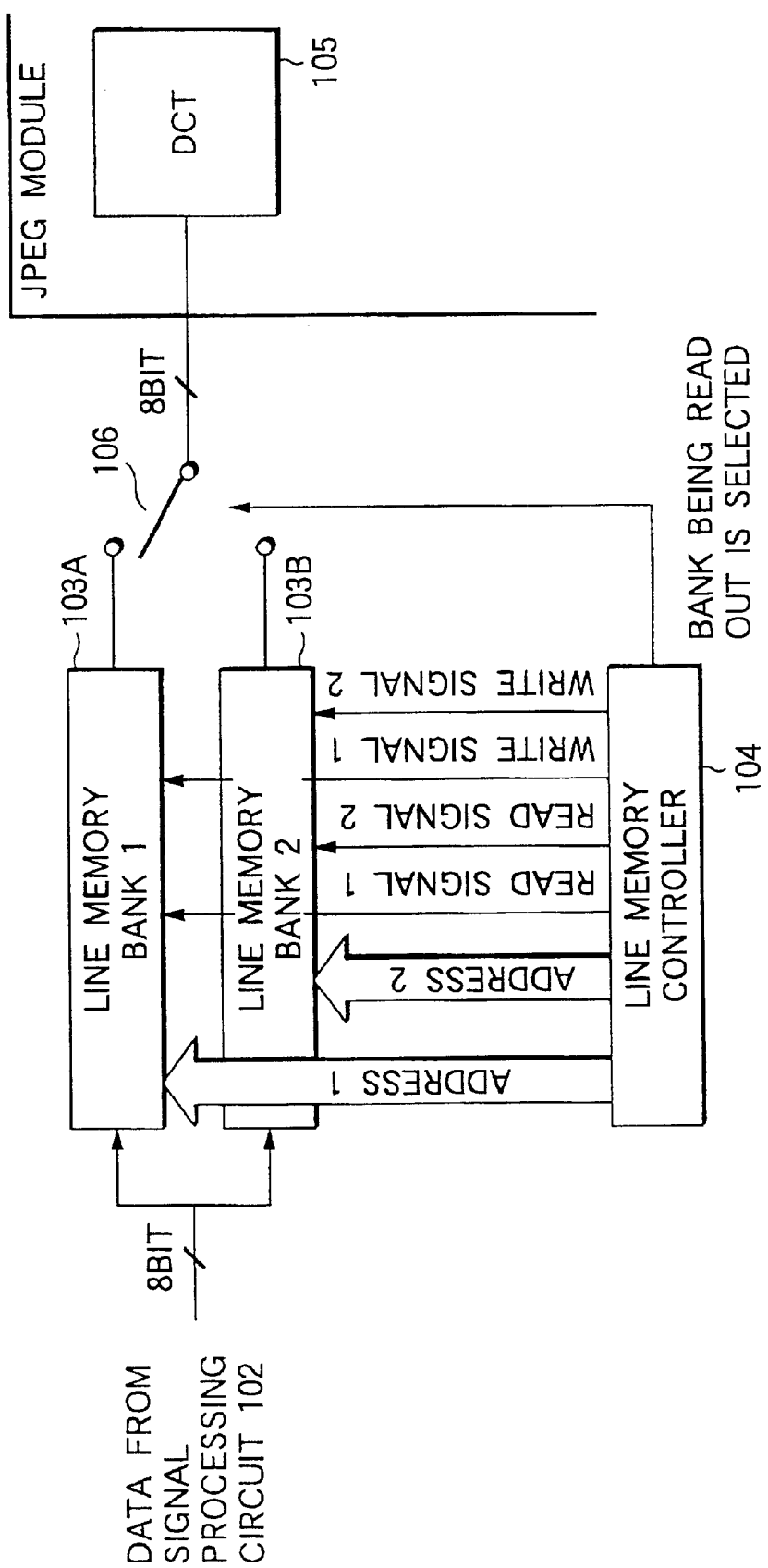

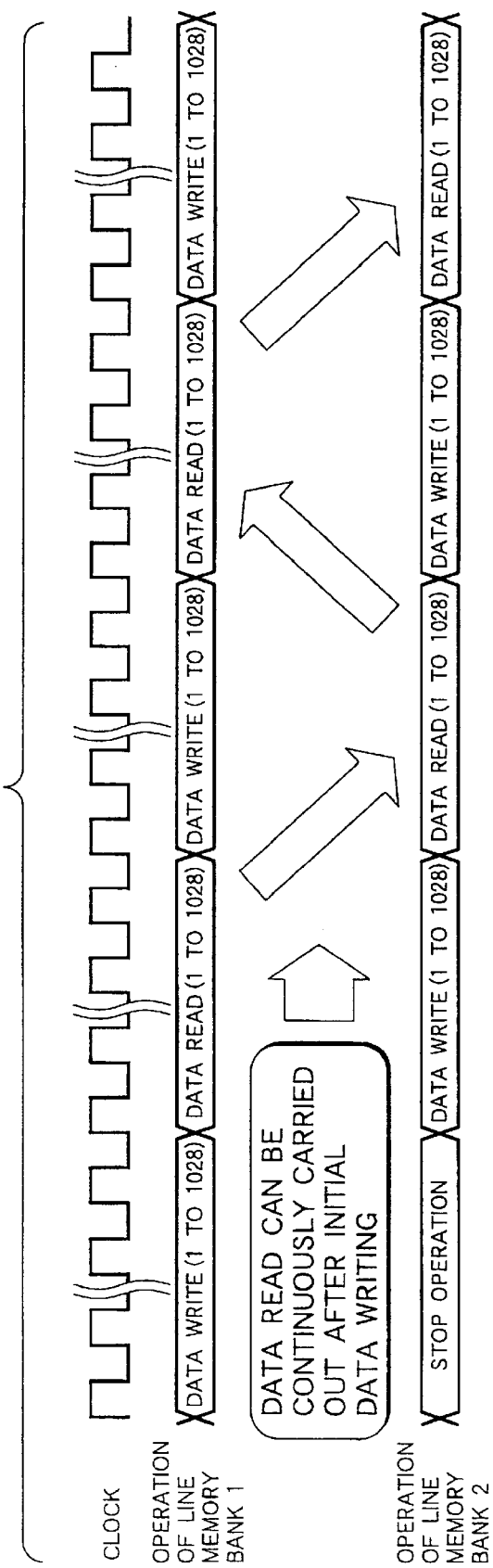

METHOD OF CONTROLLING LINE MEMORY

BACKGROUND OF THE INVENTION

1. Field of the Invention

The present invention relates to a method of controlling a line memory, and particularly to a method of controlling an image data writing/reading operation of a line memory for use in a signal processing system for carrying out image compression processing such as JPEG or the like.

2. Description of the Related Art

When still image compression processing, for example, JPEG image compression processing is carried out, image data of 8×8 pixels in horizontal and vertical directions are required. In a case where this JPEG image compression processing is applied to a signal processing system of a camera system using, for example, a CCD image pickup element as an image pickup device, for image data of 8×8 pixels or more, image data must be temporarily written into a line memory and then successively read out on a 8×8-line basis every data in the horizontal direction because the image data obtained by subjecting the signal processing to image pickup signals of the CCD image pickup element are output line by line.

FIG. 15 shows the construction of a signal processing system of a conventional camera system using a CCD image pickup element as an image pickup device.

In FIG. 15, the output signal (image pickup signal) of a CCD image pickup element 101 is subjected to various signal processing in a signal processing circuit 102 and then input to a line memory 103. FIG. 16 shows an image for the original image of image data output from the signal processing circuit 102. In FIG. 16, an arrow (1) represents the order of the image data output from the signal processing circuit 102. The area indicated by an arrow (2) represents a block (8 pixels in horizontal direction and 8 pixels in vertical direction) which is the processing unit of the JPEG image compression.

As an example, the image size is set to 128 pixels in the horizontal direction×64 pixels in the vertical direction. When the JPEG image compression processing is carried out on the image data having this image size, a line memory having a memory capacity of 128 pixels in the horizontal direction, 8 pixels (8 lines) in the vertical direction and 8 bits for each data is used as the line memory 103. At this time, the addresses are set to 1 to 1024. Further, this memory capacity is defined as one bank.

The control of the data write/read operation to the line memory 103 having a capacity of one bank is carried out by a line memory controller 104. The data read out from the line memory 103 are supplied to a DCT (Discrete Cosine Transformation) circuit 105 of a JPEG module.

FIG. 17A shows the writing order of data into the line memory 103 and FIG. 17B shows the reading order of data from the line memory 103. That is, as is apparent from FIG. 17A, in the data writing operation, 128 pixels (data) are set on one line and the image data are successively written into the line memory 103 line by line from a first line till an eighth line. On the other hand, as is apparent from FIG. 17B, in the data reading operation, 8 pixels in one line×8 lines are set as one block and the image data are successively read out data by data every line within each block.

In the case of the prior art 1 using the line memory 103 having a memory capacity of only one bank as described above, the image data are successively written into the line memory 103 line by line whereas the image data are successively read out data by data every line on a block basis. Therefore, as shown in the timing chart of FIG. 18, "wait" is applied to the data reading processing every time the reading operation of the data on one line in the horizontal direction of 8×8 pixels is finished.

Further, since the memory capacity of the line memory 103 is one bank, the data reading operation and the data writing operation must be alternately carried out. Therefore, the data from the signal processing circuit 102 cannot be processed on a real-time basis. That is, the data reading operation and the data writing operation can be alternately carried out at the first stage of the first line, however, the image data cannot be processed on a real-time basis because only one data can be stored in one address.

On the other hand, a signal processing system using a line memory having a memory capacity of 2 banks is also known. As shown in FIG. 19, the signal processing system of the prior art 2 has two line memories 103A and 103B each having a memory capacity of one bank, and image data of 128 pixels×8 pixels in image size are alternately written into each of the line memories 103A and 103B while the image data are alternately read out from each of the line memories 103A and 103B which does not carry out the writing operation, and then supplied to a DCT circuit 105 of the JPEG module through a selection switch 106.

In the case of the prior art 2, as is apparent from the timing chart of FIG. 20, it is possible to carry out the writing/reading operation of the image data to the line memory on a real-time basis. However, the memory capacity is twice as large as that of the prior art 1 because it has a memory capacity corresponding to two banks. Therefore, the circuit scale of the prior art 2 is large and thus the cost is increased.

SUMMARY OF THE INVENTION

The present invention has been implemented in view of the foregoing situation, and has an object to provide a line memory controlling method which can perform the real-time processing of image data with a smaller amount of memory capacity.

According to the present invention, there is provided a line memory control method for temporarily writing input image data into a line memory and reading out the image data written in the line memory on a block basis, comprising: a pre-processing step of reducing the data rate of the input image data; a writing step of successively writing the pre-processed image data into a line memory every line by using a first address; and a reading/writing step of reading out the image data on a line basis every block by using a second address different from the first address after said writing step is finished, and writing image data into a read-out block by using the second address.

When the image data are written into the line memory, the data rate of the input image data is first reduced in the pre-processing. Therefore, even when the line memory is a single port, the writing and reading operations of the image data to the line memory can be carried out in parallel. After the image data of the image size which have been subjected to the pre-processing are successively written into the line memory line by line, the processing is shifted to the reading operation of the image data on a block basis. At this time, image data are successively read out on a line basis every block, and image data are successively written at the same addresses as used in the reading operation into a block from which the image data have been read out. The reading/writing processing is carried out on all the blocks.

BRIEF DESCRIPTION OF THE DRAWINGS

FIG. 4 is a diagram (part 1) of an address map;

FIG. 5 is a diagram (part 2) of an address map;

FIG. 6 is a diagram (part 1) of a line memory image;

Figures 7A, 7B:
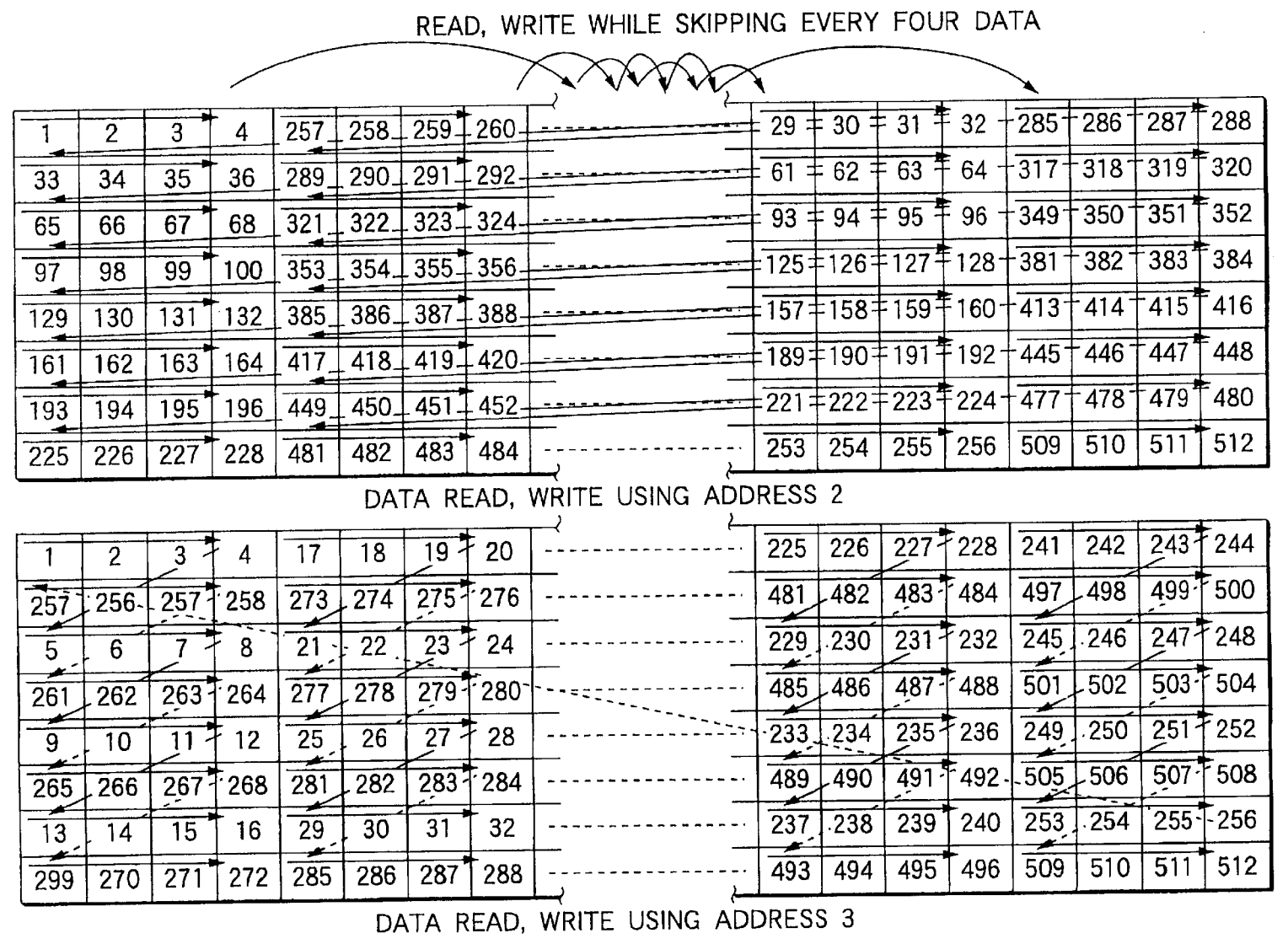

FIG. 7 is a diagram (part 2) of a line memory image;

FIG. 8 is a diagram (part 3) of a line memory image;

FIG. 17A shows a data writing order into a line memory, and FIG. 17B shows a data reading order from a line memory;

FIG. 18 is a timing chart for the prior art 1;

FIG. 19 is a block diagram showing the construction of an image signal processing circuit according to a prior art 2; and FIG. 20 is a timing chart for the prior art 2.

DETAILED DESCRIPTION OF THE PREFERRED EMBODIMENTS

Preferred embodiments according to the present invention will be described hereunder with reference to the accompanying drawings.

Figure 1:
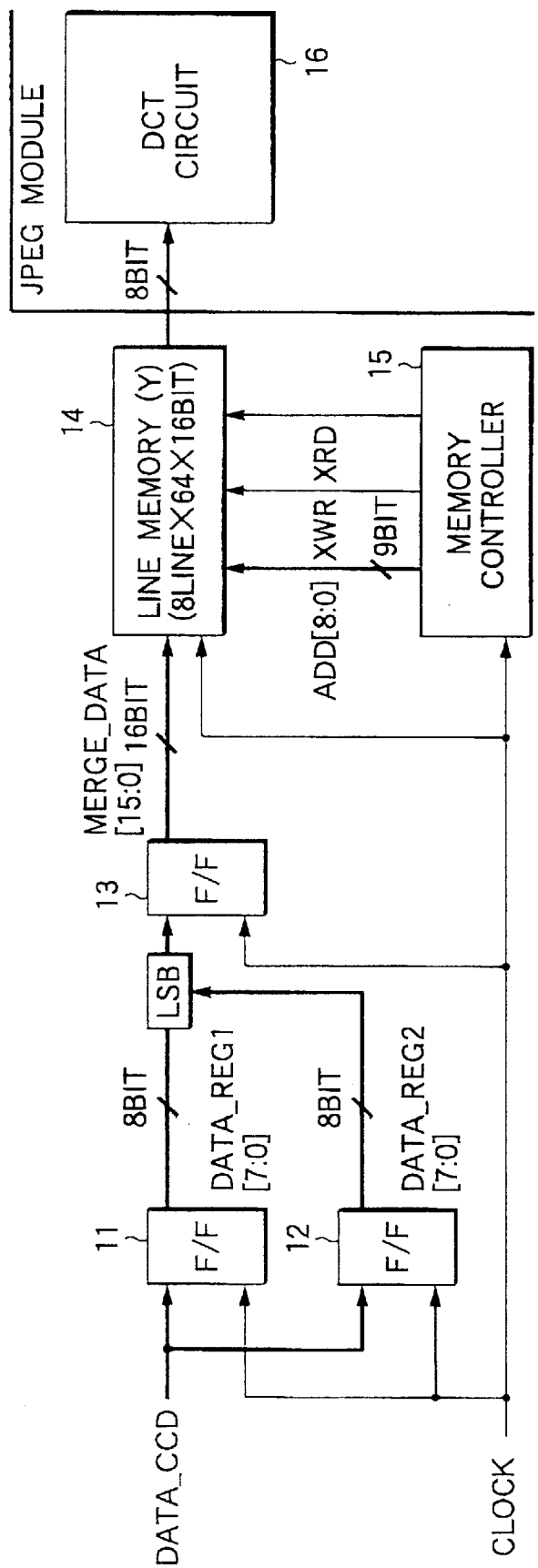
FIG. 1 is a block diagram showing the construction of an image signal processing circuit according to an embodiment of the present invention.

FIG. 1 is a block diagram showing the construction of a signal processing system to which a line memory control method according to an embodiment of the present invention is applied.

In this embodiment, JPEG data are set to satisfy Y:Cb:Cr= 4:2:2, and only the processing on Y(brightness) data will be described. The processing on each of Cb, Cr (color difference) data is the same as the processing on the Y data. Further, the image size is set to the same as the prior art, that is, it is set to 128 pixels in the horizontal direction×64 pixels in the vertical direction. It is assumed that the signal processing system according to this embodiment is supplied with image data DATA_ccd which are output from a CCD image pickup element and subjected to the signal processing in the signal processing circuit.

In FIG. 1, two latch circuits 11 and 12 each of which comprises a flip flop (F/F) alternately hold the image data DATA_ccd thus input in synchronism with clocks on a data (8-bit) basis. Two data which are held in the latch circuits 11, 12 are held by a latch circuit 13 comprising F/F in synchronism with the clocks, whereby these data are merged into 16-bit data.

That is, the image data DATA_ccd is held in parallel every data amount corresponding to two data in the pre-processing of the latch circuits 11, 12 and 13, and then the merging processing is carried out on these data to compress the image data to the half in the time axis direction, thereby reducing the data rate to the half. The image data merge_data (16 bits per data) are input to a line memory 14 comprising RAM or the like. As the line memory 14 is used one having a single port which is smaller in the number of gates and in circuit scale as compared with one having dual ports.

In the line memory 14, two data (merged data merge_data) are written into one address for 128 data (pixels) on one line, whereby one line is constructed by 64 addresses. Further, when the JPEG compression processing is carried out, data are needed on an 8×8 block basis, and thus the line memory 14 has eight lines. That is, the memory capacity of the line memory 14 is equal to one bank.

The control of the write/read of the data to the line memory 14 is carried out by a line memory controller 15. That is, the line memory controller 15 supplies a write signal xwr or read-out signal xrd to the line memory 14, and also supplies an address signal Add for specifying the data writing/reading position to the line memory 14. The data read out from the line memory 14 are supplied to a DCT circuit 16 of a JPEG module.

Figure 2:
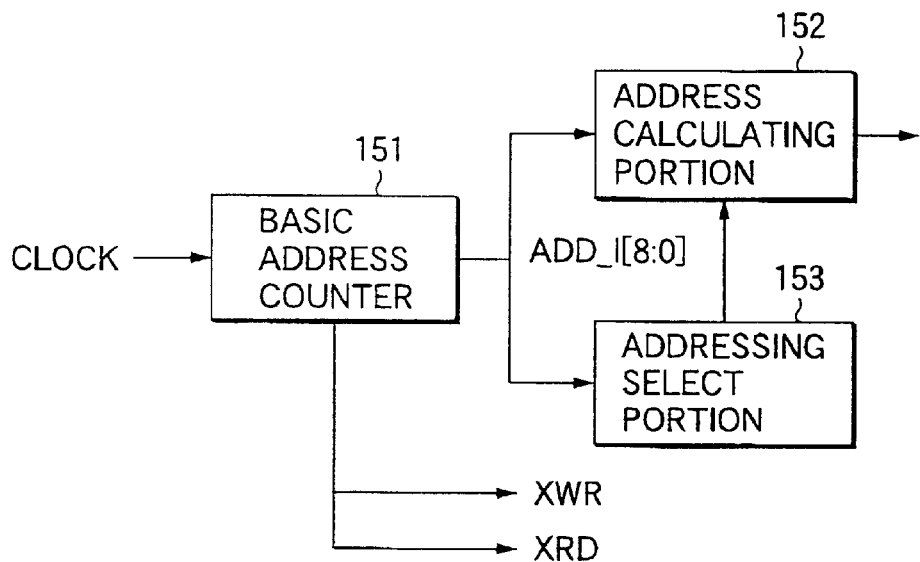
FIG. 2 is a block diagram showing the internal circuit construction of a line memory controller.

FIG. 2 is a block diagram showing the internal circuit construction of a line memory controller 15. In FIG. 2, the line memory controller 15 comprises a basic address counter 151, an address calculating portion 152 and an addressing select portion 153.

The basic address counter 151 counts a count value from "1" to "512" in synchronism with clocks (Clock). When the basic address counter 151 counts the count value from "1" till "512", the addressing select portion 153 notifies variation of the addressing to the address calculating portion 152. Upon receiving this notification, the address calculating portion 152 selects any one of the addresses 1 to 6, and outputs it as an address signal Add.

Figure 3:
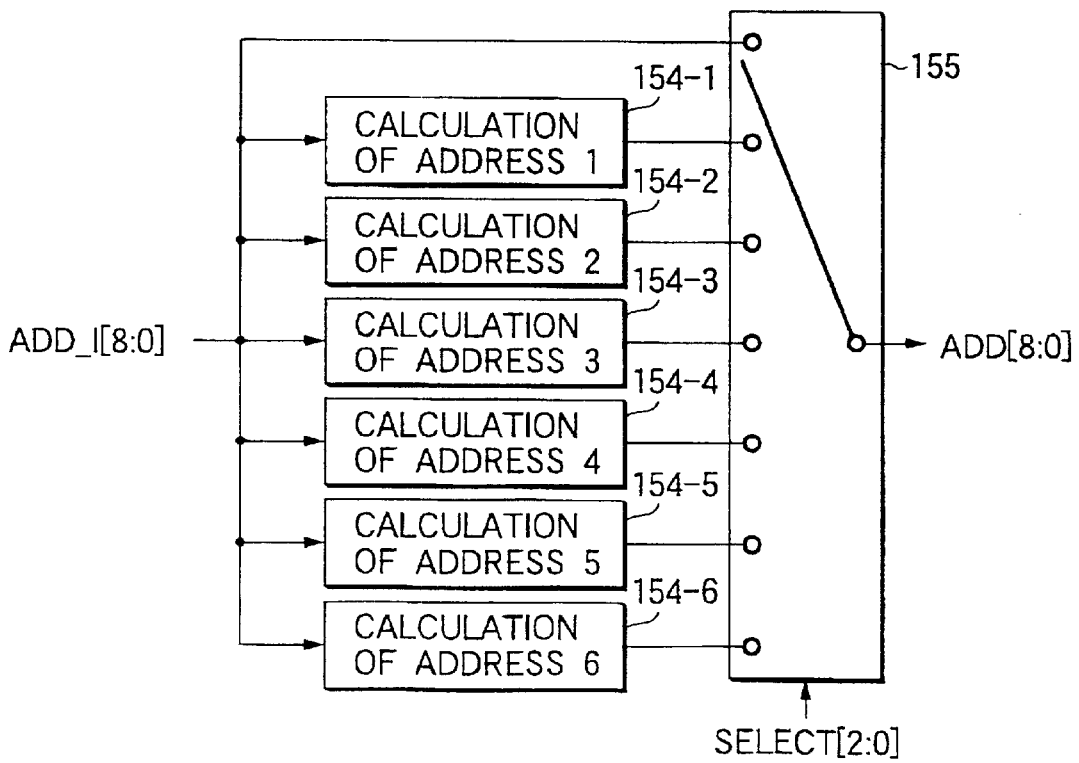
FIG. 3 is a block diagram showing the internal construction of an address calculating portion.
Figure 9:
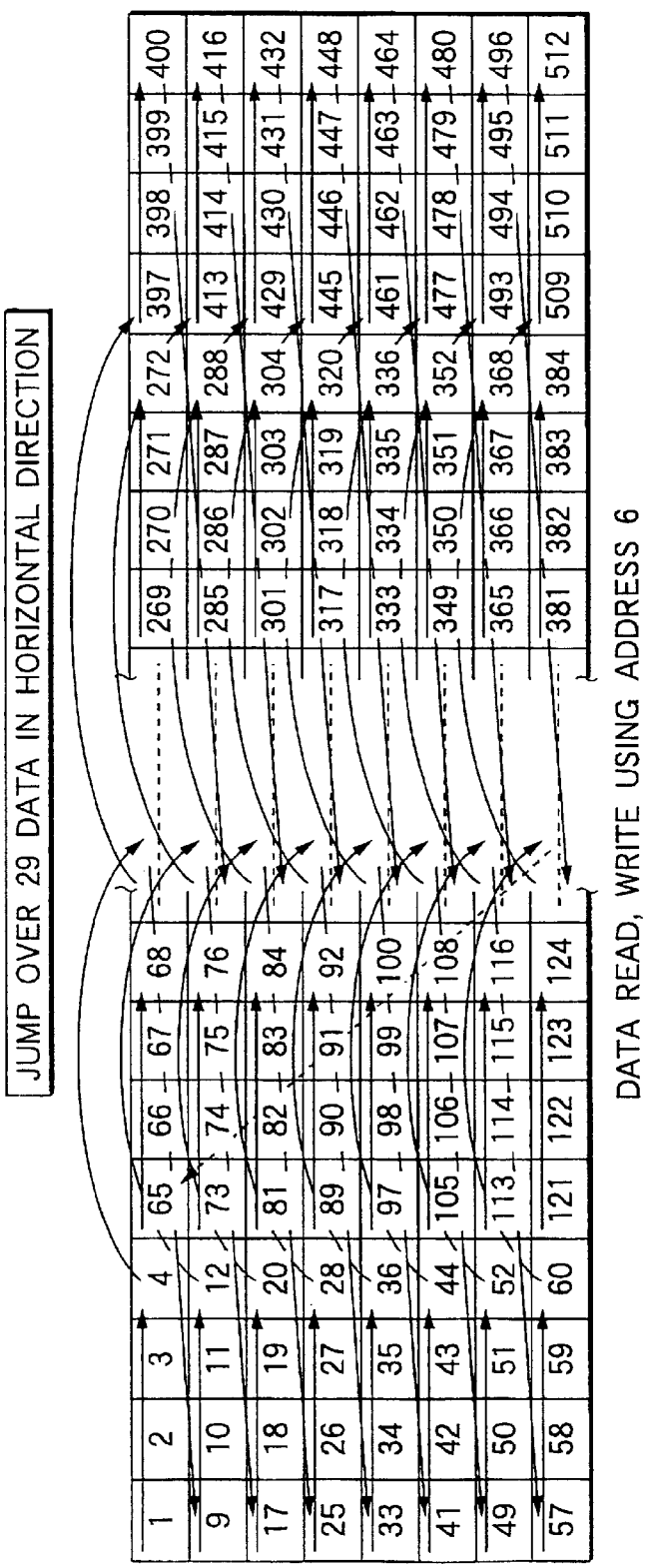
FIG. 9 is a diagram (part 4) of a line memory image.

As shown in FIG. 3, the address calculating portion 152 comprises calculators 154-1 to 154-6 for carrying out the calculations of the addresses 1 to 6 respectively, and a selection switch 155 for selecting any one of the address 0 (basic address count) and the addresses 1 to 6 calculated in the respective calculators 154-1 to 154-6 of the addresses 1 to 6 and outputting the selected one as the address signal Add.

Here, a basic address count (address 0) shown in address maps of FIGS. 4 and 5 is used in the initial image data writing operation. In FIGS. 4 and 5, only the address maps of 1st block and 16th block are representatively shown, and the address maps of 2nd to 15th blocks are omitted. The address maps shown in FIGS. 4 and 5 are shown in the form of a line memory image in FIGS. 6 to 9.

FIGS. 6 to 9 show line memory images after the writing operation when the address 0 and the addresses 1 to 6 are used, respectively.

That is, as is apparent from FIG. 6A, in the initial image data writing operation, image data of 64 addresses per line are successively written into the line memory 14 from the first line to the eighth line every line. Just after the writing operation on all the data is completed, the data reading operation is carried out.

When the image data are read out from the line memory 14, the address 1 is used to read out the data in the horizontal direction (line direction) in a block of 4 pixels in the horizontal direction×8 pixels in the vertical direction. The data writing operation is carried out by using the same address 1. The data writing operation and the data reading operation as described above are alternately carried out with a time lag of one clock. That is, with respect to a block from which data are read out by using the address 1, the data writing operation is carried out on the block with a time lag of one clock by using the same address 1. Likewise, the data reading operation and the data writing operation are alternately carried out with a time lag of one clock by using the same address.

That is, the image data writing/reading operation to the line memory 14 is controlled in such an addressing mode that in the initial image data writing operation, the image data having 64 addresses on one line are successively written from the first line to the eighth line every line. However, in the block-based reading operation, image data are read out by successively using the addresses 1, 2, 3, 4, 5 and 6 in this order while image data are successively written by using the same addresses 1, 2, 3, 4, 5 and 6.

Figure 10:
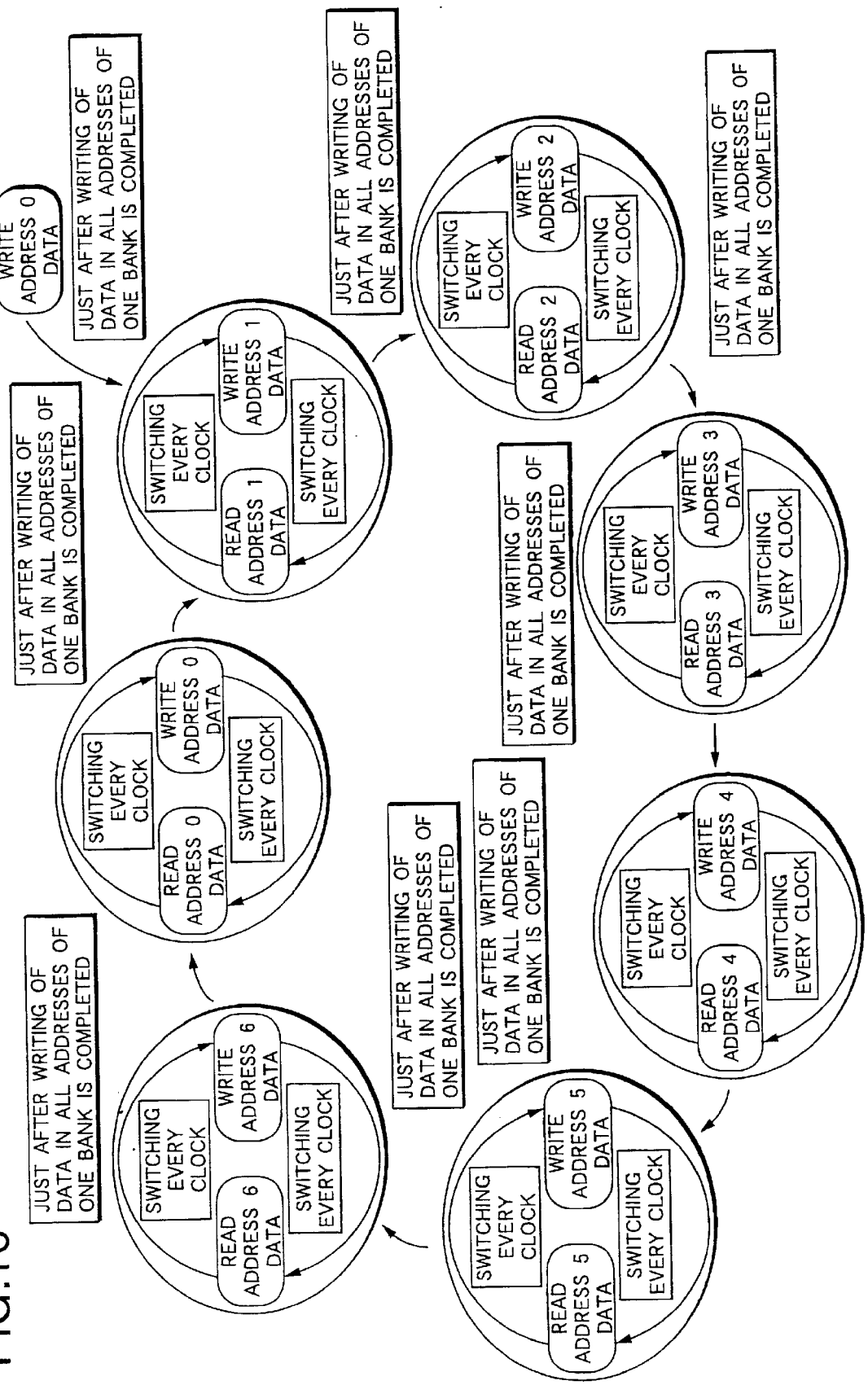
FIG. 10 is a diagram showing a loop of addressing.

When the read-out address of the image data is varied just after the initial image data writing operation is finished, the writing address of the image data is also varied. Further, the addressing is returned to the original one after it is carried out six times. The variation of the addressing is shown in FIG. 10.

Here, the regularity of the addressing will be described. The relationship between the basic address count shown in FIGS. 4 and 5 and the addresses 1, 2, 3, 4, 5, 6 is indicated by the following equations.

Address 0=basic address count

Address 1=60×(the number of lines being processed within one block−1)−28×(the number of blocks under processing−1)+basic address count Regarding the address 2
when the reading/writing operation of data of first to eighth blocks is carried out, address 2=4×(the number of lines being processed within eight blocks−1)+basic address count when the reading/writing operation of data of ninth to sixteenth block is carried out, address 2=−252+4×(the number of lines being processed within eight blocks−1)+basic address count The number of lines being processed is cleared after the counting of eight blocks (64 lines) is completed.

Address 3=2×62×(the number of lines being processed within one block−12)×(the count number of 1/2 block being processed−1)+basic address count Here, the 1/2 block means a half of one block (four lines).
Regarding the address 4,
for first to fourth block, address 4=12×(the number of lines being processed within four blocks−1)+basic address count for fifth to eighth block address 4=−124+12×(the number of lines being processed within four blocks−1)+basic address count for ninth to twelfth block address 4=−248+12×(the number of lines being processed within four blocks−1)+basic address count for thirteenth to sixteenth block address 4=−372+12×(the number of lines being processed within four blocks−1)+basic address count Regarding the address 5,
when the number of lines being processed is odd, address 5=−4×(the odd number of lines being processed−1)+basic address count when the number of lines being processed is even, address 5=252−4×(the even number of lines being processed−1)+basic address count address 6=28×(the number of lines being processed within two blocks−1)−60×(the number of blocks being processed every two blocks−1)+basic address count FIG. 11 shows the timing chart when the above addressing is used.

Figure 11:
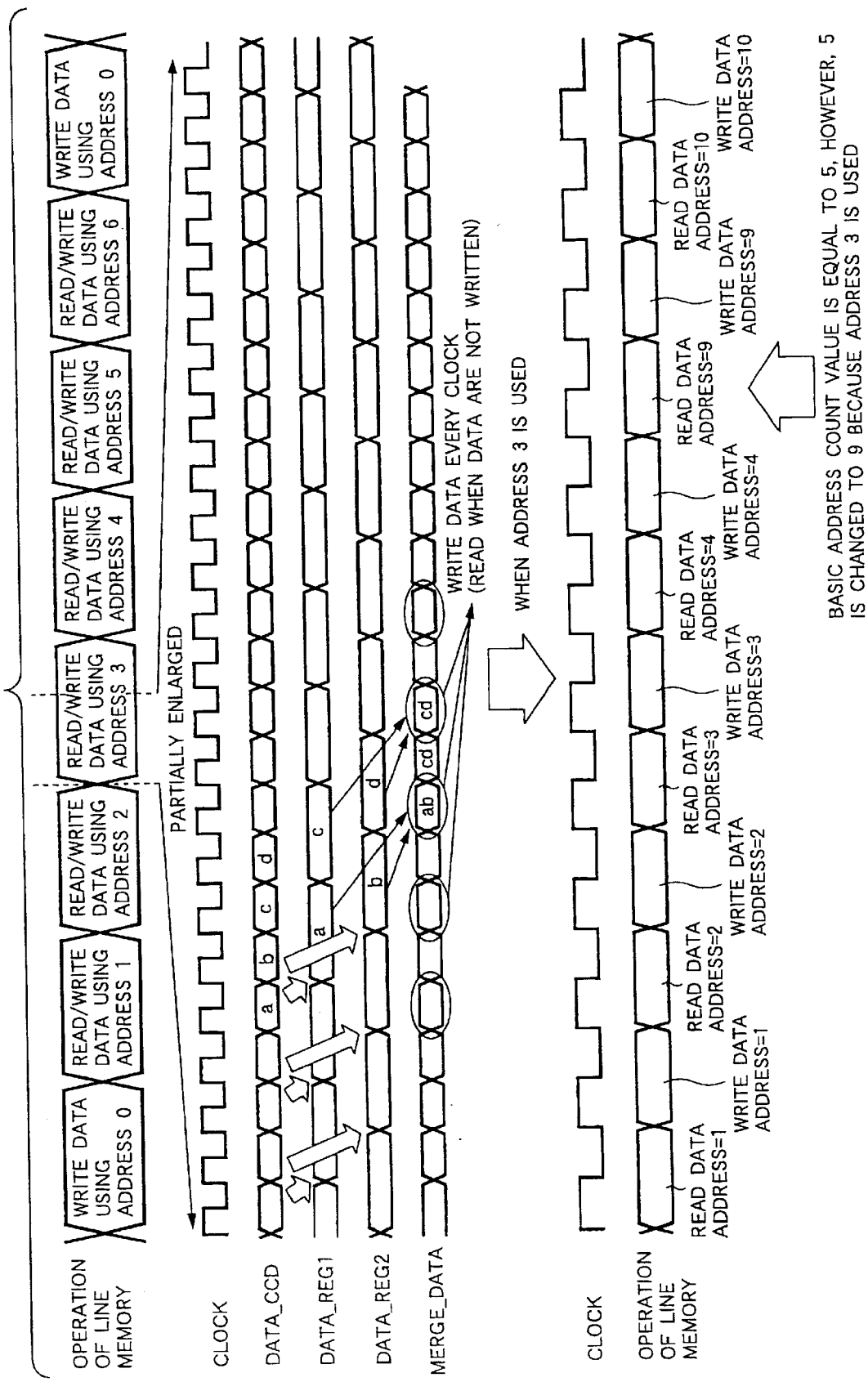
FIG. 11 is a timing chart showing the circuit operation according to the embodiment.

In FIG. 11, the data a, b, c, d are set as data of 8 bits. Here, the circuit operation of FIG. 1 will be described with reference to the timing chart of FIG. 11.

In FIG. 1, when the data writing operation is carried out, input data DATA_ccd are held in the latch circuits 11, 12 every clock. Subsequently, the two data Data_reg1,2 (Data_reg1 corresponds to MSB, Data_reg2 corresponds to LSB) held in the latch circuits 11, 12 are held in the latch circuit 13 to be merged, and the data merge_data thus merged are written/read into/from the line memory 14 under the control of the memory controller 15.

Specifically, as described above, in the initial image data writing operation, the image data having 64 addresses on one line are successively written into the line memory 14 from the first line to the eight line every line. Just after the writing operation of the overall initial image data is completed, the image data reading/writing operation is carried out on a block basis in the addressing mode as described above.

When the image data reading operation is carried out, the same data rate as a line memory having a memory capacity of two banks is achieved in a line memory 14 having a memory capacity of one bank because two data are read out through one read-out operation.

As is apparent from the foregoing description, according to the control method of the writing/reading operation of the line memory 14, that is, the addressing method of this embodiment, no "wait" is applied to the image data writing/reading operation in the line memory 14 having a memory capacity of one bank, and the processing on a real-time basis can be performed.

Therefore, the same processing performance as the line memory having the memory capacity of two banks can be achieved by the line memory 14 having the memory capacity of one bank. Therefore, the memory capacity of the line memory 14 can be reduced to half with keeping the same processing speed as the line memory having the memory capacity of two banks, and thus the circuit scale and the cost can be reduced. This embodiment is more effective to reduce the memory capacity of the line memory 14 particularly when the image size is a multi-pixel size like graphics display standards such as VGA of 800 pixels×600 pixels, XGA of 1024 pixels×768 pixels, etc.

APPLICATION EXAMPLE

If the size in the horizontal direction of the line memory 14 is equal to a multiple of 64, the addressing method according to the above embodiment can be applied. Next, developed formats of the addresses 1 to 6 will be described hereunder.

In the following description, the number of pixels in the horizontal direction of the line memory is represented by HN.

> Address 1=(HN31 4)×(the number of lines within one block−1)−28×(the number of blocks until the block being processed−1)+ basic address count Regarding address 2 when data of first to (HN/8)-th blocks are read out/written,

> address 2=4×(the number of lines being processed−1)+basic address count when data of (HN/8+1)-th and subsequent blocks are read out/written, > address 2=−252+4×(the number of lines being processed−1)+basic address count Here, (the number of lines being processed) means the number of lines within (HN (the number of pixels in the horizontal direction of the line memory)/8).

> Address 3=2×(HN−2)×number of lines−12×(count number of 1/2 block being processed−1)+basic address count Here, 1/2 block means a half of one block (four lines).

> Address 4=−124×((the number of processed blocks−1)/4)+12×(the number of lines being processed within four blocks−1)+basic address count Here, (number of blocks being processed−1)/4 is an integer, and decimals are neglected.

Regarding the address 5, when the number of lines being processed is odd,

> address 5=−4→(the odd number of lines being processed−1)+basic address count when the number of lines being processed is even, > address 5=(total address number/2−4)×−4×(the even number of lines being processed−1)+basic address count Here, each of the even number of lines and the odd number of lines is the number of lines which have been processed.

> Address 6=(HN/2−4)×(the number of lines being processed within 2 blocks−1)−60×(the number of blocks being processed every two blocks−1)+basic address count

[Modification]

The above embodiment has been described by applying to the case where the format of 4:2:2 is used. However, the present invention is not limited to this format, and the present invention may be applied to a format of 4:1:1 in the same way.

Figure 12:
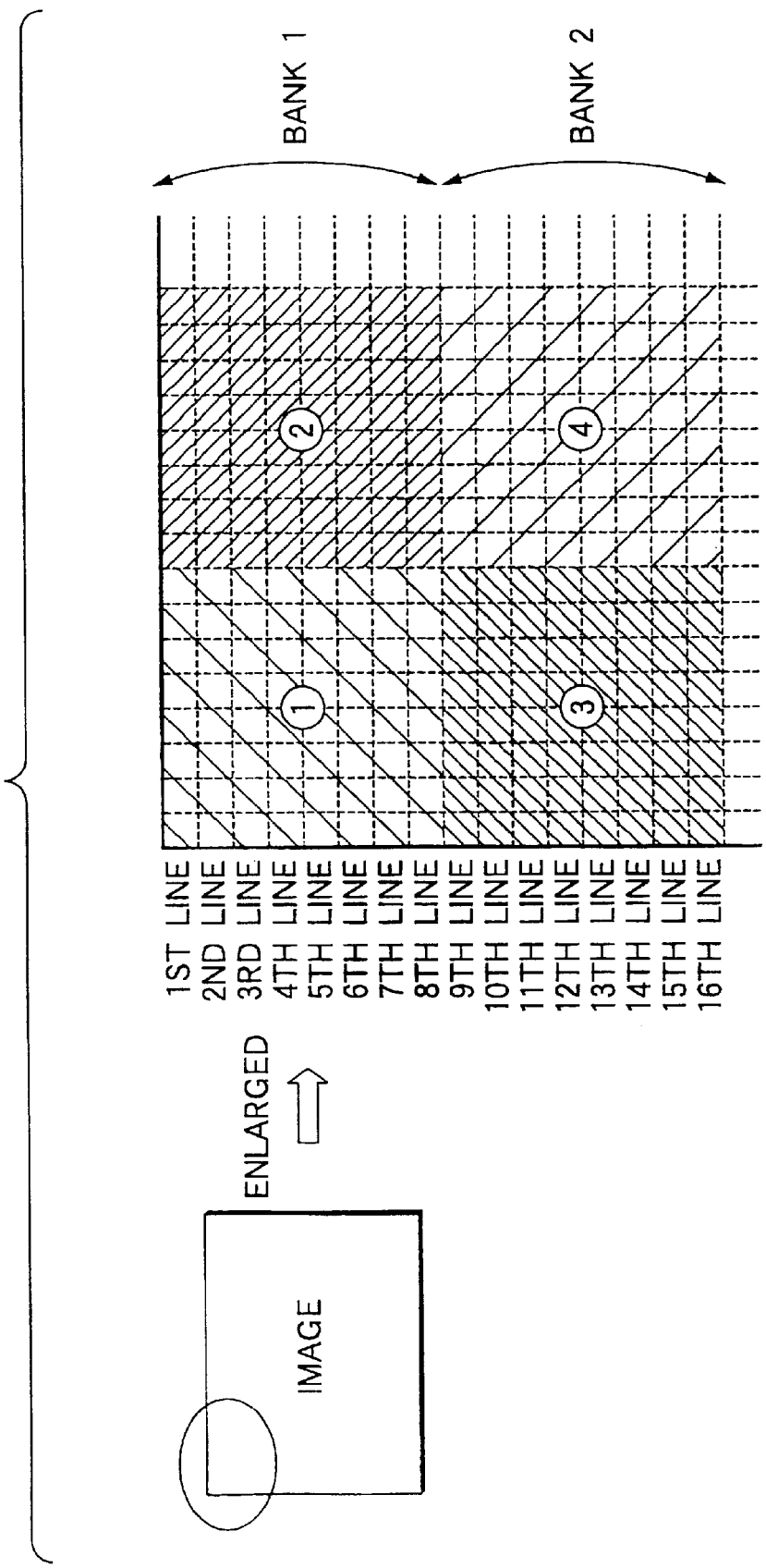
FIG. 12 is a diagram showing 4:1:1: format in JPEG.
Figure 13:
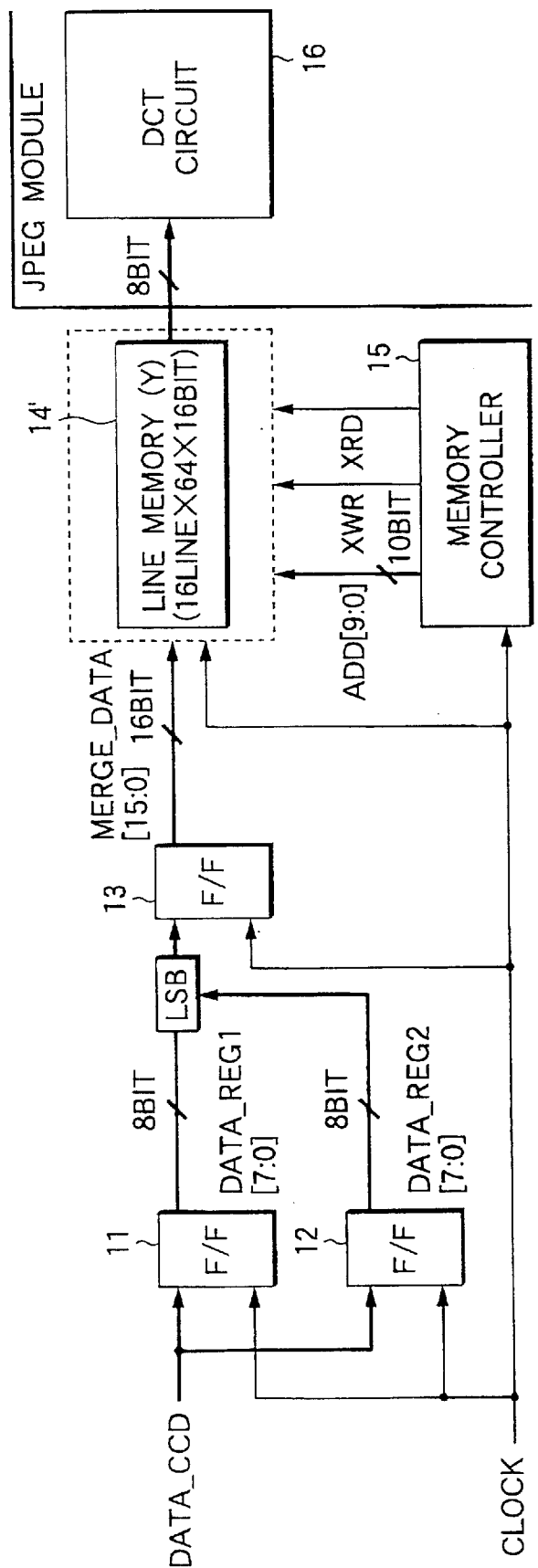
FIG. 13 is a block diagram showing a modification of this embodiment.

As shown in FIG. 12, in the format of 4:1:1, the read-out order of blocks of Y data is set like block (1)→block (2)→block (3)→block, and thus data are lack in the case of the memory capacity of eight lines. Therefore, in the case of the 4:1:1 format, a line memory having a memory capacity of 16 lines (line memory of 8 lines×2) is used as a line memory 14' as shown in FIG. 13.

Here, in order to enable the real-time processing by applying the conventional addressing to the 4:1:1 format, it is necessary to temporarily write the data of all the sixteen lines and then carry out the data reading/writing operation. Therefore, a line memory is required to have a memory capacity of 32 lines.

On the other hand, by slightly modifying the addressing method according to the above embodiment, the present invention can support the read-out order of blocks in the case of the 4:1:1 format. Accordingly, even in the case of the 4:1:1 format, the real-time processing can be performed by using a line memory 14' having a memory capacity of 16 lines.

Figure 14:
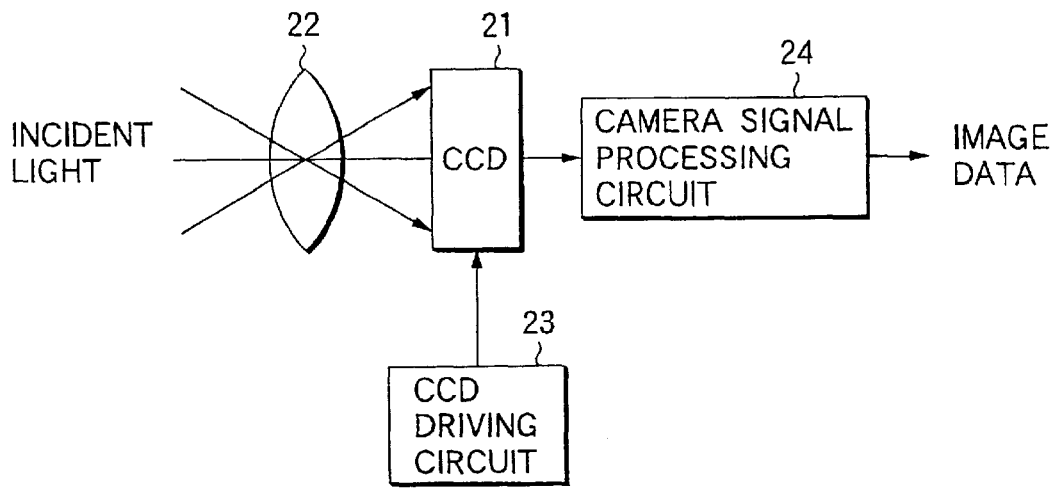
FIG. 14 is a schematic diagram showing the construction of a camera system according to the present invention.
Figure 15:
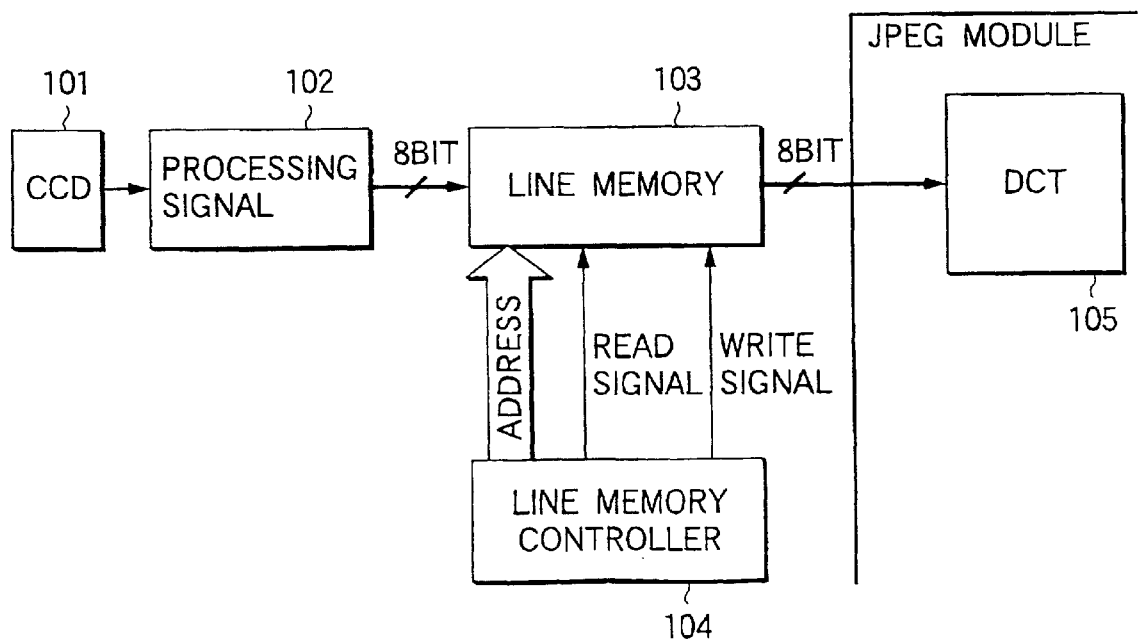
FIG. 15 is a block diagram showing the construction of an image signal processing circuit according to a prior art 1.
Figure 16:
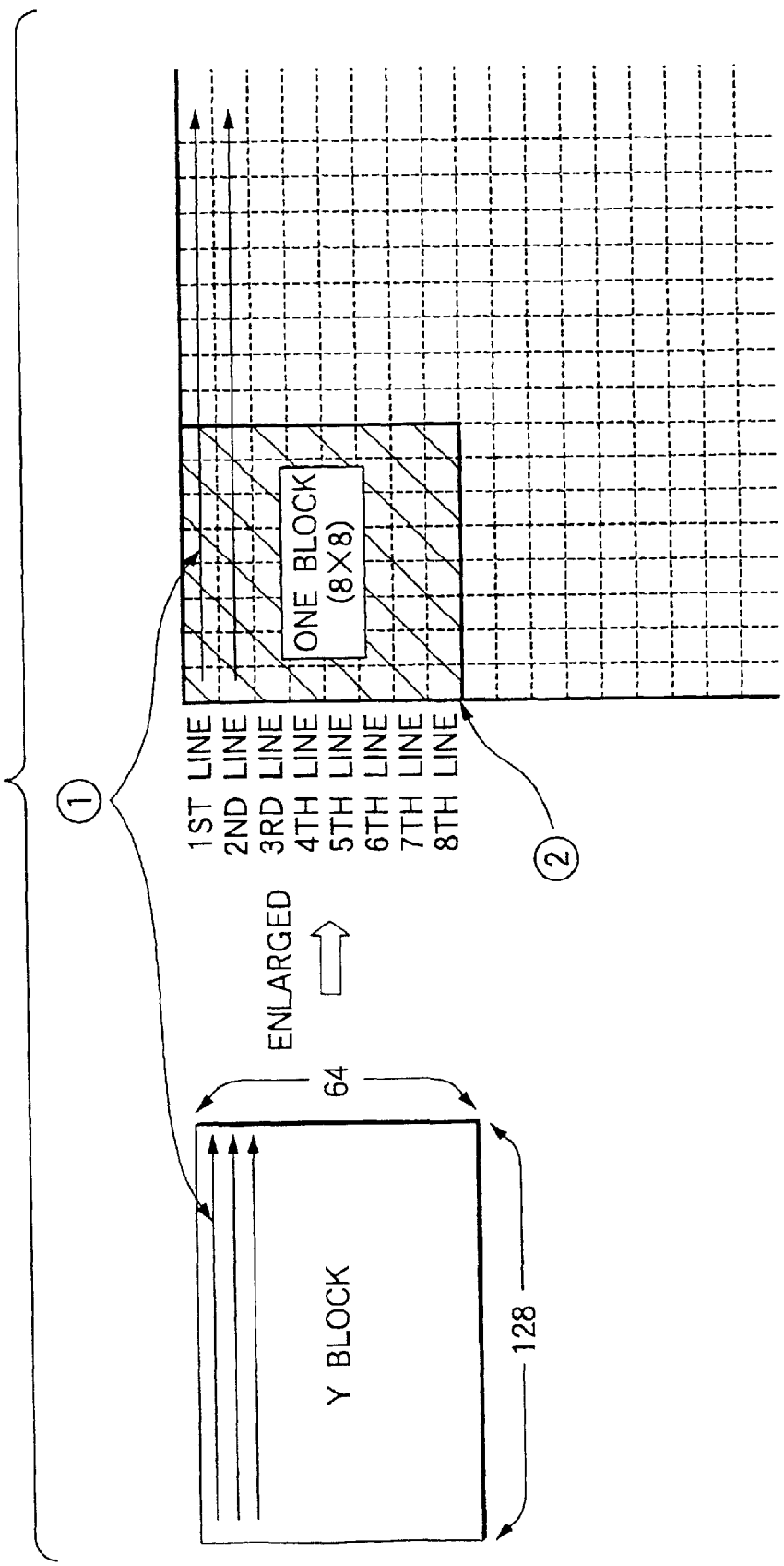
FIG. 16 shows an image for the original image of image data output from a signal processing unit.

FIG. 14 schematically shows the construction of a camera system to which the line memory control method of the present invention is applied. In FIG. 14, the camera system of the present invention includes a solid-state image pickup element such as a CCD image pickup element 21 as an image pickup device, a lens 22 constituting a part of an optical system, a CCD driving circuit 23 for driving the CCD image pickup element 21 and a camera signal processing circuit 24 for processing the output signal of the CCD image pickup element 21.

In the camera system thus constructed, incident light (image light) from a subject (not shown) is focused on the imaging face of the CCD image pickup element 21 by the lens 22 of the optical system. The CCD image pickup element 22 has photoelectric conversion elements (pixels) arranged in a two-dimensional matrix form. A signal charge obtained through the photoelectric conversion in each photoelectric conversion element is transferred and then converted to an electrical signal, and the electrical signal thus obtained is output.

A camera signal processing circuit 24 conducts signal processing such as correlated double sampling (CDS) processing or the like on an analog signal output from the CCD image pickup element 22, and after the analog signal thus processed is converted to a digital signal, the camera signal processing circuit 24 conducts the pre-processing of converting the digital signal to Y (brightness) data and Cb, Cr (color difference) data. Thereafter, these data are temporarily stored in the line memory and subjected to image compression processing such as JPEG or the like. The line memory control method according to the above embodiment is used for the image compression processing.

As described above, by applying the line memory control method of the above embodiment to the image compression processing such as JPEG or the like in the camera system such as a digital still camera or the like, the same processing performance as a line memory having a memory capacity of two banks can be achieved by a line memory having a memory capacity of one bank. Therefore, the memory capacity can be reduced to a half with keeping the same processing speed as the line memory having the memory capacity of two banks, and thus the circuit scale and the cost can be reduced.

In the foregoing description, the present invention is applied to a camera system such as a digital still camera or the like. However, the present invention is not limited to the camera system. The line memory control method of the present invention may be applied to various systems for carrying out image compression processing such as JPEG, MPEG, etc.

As described above, according to the present invention, the data rate of the input image data is first reduced in the pre-processing. In the initial writing operation, the image data having the data amount corresponding to the image size which have been subjected to the pre-processing are successively written into the line memory every line. In the block-based image data reading operation after the writing operation is finished, the image data are read out on a line basis every block, and by using the same addresses as the reading operation, image data are written into a block from which the image data are read out. This processing is successively carried out on all the blocks. Accordingly, the memory capacity of the line memory can be reduced to a half with keeping the same processing as the line memory having the memory capacity of two banks, so that the circuit scale can be reduced and the cost can be also reduced.

What is claimed is:

1. A line memory control method for temporarily writing input image data into a line memory and reading out the image data written in the line memory on a block basis, comprising:

a pre-processing step of reducing the data rate of the input image data;

a writing step of successively writing the pre-processed image data into a line memory every line by using a first address; and a reading/writing step of reading out the image data on a line basis every block by using a second address different from the first address after said writing step is finished, and writing image data into a read-out block by using the second address.

2. The line memory control method as claimed in claim 1, wherein said pre-processing step is a processing step of merging image data of two continuous data to reduce the data rate of the image data.

3. The line memory control method as claimed in claim 1, further comprising a second reading/writing step of reading out the image data written with the second address by using a third address different from the first address and the second address, and writing image data by using the third address.

4. The line memory control method as claimed in claim 1, wherein the image data thus read out are supplied to a discrete cosine transformation circuit.

* * * * *